(12) United States Patent
Yun

(10) Patent No.: US 12,183,614 B2
(45) Date of Patent: Dec. 31, 2024

(54) TRANSPORTATION SYSTEM OF A CASSETTE AND METHOD OF AUTO TEACHING A POSITION OF A CASSETTE

(71) Applicant: RORZE SYSTEMS CORPORATION, Yongin-si (KR)

(72) Inventor: Jeong Tae Yun, Yongin-si (KR)

(73) Assignee: RORZE SYSTEMS CORPORATION, Yongin-si (KR)

( * ) Notice: Subject to any disclaimer, the term of this patent is extended or adjusted under 35 U.S.C. 154(b) by 548 days.

(21) Appl. No.: 17/591,003

(22) Filed: Feb. 2, 2022

(65) Prior Publication Data

US 2023/0064709 A1 Mar. 2, 2023

(30) Foreign Application Priority Data

Aug. 30, 2021 (KR) .......................... 10-2021-0114381

(51) Int. Cl.
*H01L 21/68* (2006.01)
*B65G 43/00* (2006.01)
*H01L 21/677* (2006.01)

(52) U.S. Cl.
CPC .............. *H01L 21/68* (2013.01); *B65G 43/00* (2013.01); *H01L 21/6773* (2013.01)

(58) Field of Classification Search
CPC ...... H01L 21/68; H01L 21/6773; B56G 43/00
See application file for complete search history.

(56) References Cited

U.S. PATENT DOCUMENTS

| | | | | |
|---|---|---|---|---|
| 2002/0143427 A1* | 10/2002 | Chao | ................. | H01L 21/67781 700/213 |
| 2005/0262716 A1* | 12/2005 | Lee | ........................ | H01L 21/681 33/645 |
| 2008/0075562 A1* | 3/2008 | Maria De Ridder | ....................... | H01L 21/67769 414/217 |
| 2011/0082581 A1* | 4/2011 | Ozaki | ............... | H01L 21/67276 700/121 |
| 2018/0202777 A1* | 7/2018 | Green | .................. | G05B 19/042 |
| 2019/0033732 A1* | 1/2019 | Lee | ...................... | G03F 7/70733 |
| 2019/0164799 A1* | 5/2019 | Liu | ................... | H01L 21/67265 |
| 2020/0075373 A1* | 3/2020 | Lee | ................... | H01L 21/67775 |

FOREIGN PATENT DOCUMENTS

| | | |
|---|---|---|
| KR | 10-1725406 | 4/2017 |
| KR | 10-1816992 | 1/2018 |

* cited by examiner

*Primary Examiner* — Kyle O Logan
(74) *Attorney, Agent, or Firm* — KILE PARK REED & HOUTTEMAN PLLC

(57) ABSTRACT

A transportation system of a cassette according to an embodiment of the present invention comprises a port and a system controller. The port accommodates a cassette carrying a glass substrate. The port includes a plurality of displacement sensors for sensing a position of a cassette. The system controller calculates a distortion amount of the cassette using a plurality of sensed values of the cassette and a misplaced amount of the displacement sensors to determine whether the cassette is in a normal settlement status. Therefore, the position of the cassette can be automatically taught without clamping operation of a clamping device clamping the cassette disposed in the port, so that it is possible to prevent defects of the glass substrate by removing various defect-causing factors such as particles and static electricity that may occur during a conventional clamping operation.

12 Claims, 4 Drawing Sheets

TRANSPORTATION SYSTEM OF A CASSETTE AND METHOD OF AUTO TEACHING A POSITION OF A CASSETTE

CROSS REFERENCE TO RELATED APPLICATION

This application claims priority from and the benefit of Korean Patent Applications No. 10-2021-0114381, filed on Aug. 30, 2021, which is hereby incorporated by reference for all purposes as whether fully set forth herein.

BACKGROUND OF THE INVENTION

Field of the Invention

The present invention relates to a transportation system of a cassette and a method of auto teaching a position of a cassette, more specifically to a transportation system of a cassette for transporting a glass substrate for a flat panel display device and a method of auto teaching a position of a cassette.

Discussion of the Background

Flat panel displays (FPDs) such as plasma display panels (PDPs), liquid crystal display panels (LCDs), and organic electroluminescent display devices (OLEDs) can be easily encountered in our daily life in the form of various devices such as TVs and outdoor billboards.

In general, flat panel displays are implemented by forming an electronic circuit pattern on a glass substrate.

Various processes are performed to form an electronic circuit pattern on a glass substrate, and a plurality of glass substrates are loaded and transported in a cassette for smooth progress between each process.

The glass substrates are taken out from the cassette or introduced into the cassette by the transfer robot. In case that the robot hand is not accurately controlled, the glass substrate is damaged, when the glass substrate is inserted into the cassette or the glass substrate is taken out from the cassette using the hand of the transfer robot.

In order to solve this problem, in our Korean Patent Registration No. 10-1725406, "AUTO TEACHING SYSTEM FOR A TRANSFERRING ROBOT" and Korean Patent Registration No. 10-1816992, "AUTO TEACHING SYSTEM FOR A TRANSFERRING ROBOT", a system for teaching the robot hand when the robot hand was drawn into the cassette was disclosed.

Meanwhile, a rack master puts the cassette in the storage space in the port, a cassette clamping device aligns the cassette placed in the port to be in a proper position, and the transfer robot inserts the glass substrate into cassette or withdraws the glass substrate from the cassette to transport the glass substrate.

More specifically, when the rack master puts a rectangular parallelepiped-shaped cassette in the port, the cassette clamping device aligns the cassette in the correct position of the port through a clamping operation that presses from both diagonal corners of the cassette. Thereafter, as described in the above-described patent, the transfer robot performs an operation of inserting the glass substrate into the cassette or withdrawing the glass substrate from the cassette.

However, particles may be generated during the operation of clamping the cassette in the port, and a defect may be generated in the glass substrate loaded on the cassette due to the influence of static electricity or the like when the clamping device and the cassette come into contact.

SUMMARY OF THE INVENTION

Therefore, the technical problem of the present invention is to provide a transportation system of a cassette for automatically teaching the position of a cassette without clamping the cassette placed on a port.

The technical problem of the present invention is also to provide a method of auto teaching a position of a cassette of a transportation system of a cassette.

A transportation system of a cassette according to an embodiment of the present invention comprises a port and a system controller. The port accommodates a cassette carrying a glass substrate. The port includes a plurality of displacement sensors for sensing a position of a cassette. The system controller calculates a distortion amount of the cassette using a plurality of sensed values of the cassette and a misplaced amount of the displacement sensors to determine whether the cassette is in a normal settlement status.

According to an embodiment, the system controller may determine that the cassette is in an abnormal settlement status when the distortion amount of the cassette is greater than a tolerance value, and may generate an alarm service informing an error message.

According to an embodiment, the plurality of displacement sensors may comprise at least one front displacement sensor sensing a distance from a front part of the cassette, and at least one side displacement sensor for sensing a distance from a side part of the cassette.

According to an embodiment, the plurality of displacement sensors may comprise a first front displacement sensor and a second front displacement sensor respectively sensing distances from a first side and a second side of a front edge portion where a bottom part and a front part of the cassette are connected to each other, and a first side displacement sensor and a second side displacement sensor respectively sensing distances from a first side and a second side of a side edge portion where the bottom part and a side part of the cassette are connected to each other.

According to an embodiment, the system controller may generate a front deviation amount using first and second sensed values respectively sensed by the first and second front displacement sensors, may generate a side deviation amount using third and fourth measured sensed values respectively sensed by the first and second side displacement sensors, and may compare the front deviation amount and the side deviation amount with a first and second tolerance values, respectively to determine a normal settlement status of the cassette.

According to an embodiment, the system controller may calculate a first position deviation value by using a first distance between the first and second front displacement sensors, and first and second sensed values obtained from the first and second front displacement sensors, may calculate a second position deviation value by using a second distance between the first and second side displacement sensors, and third and fourth sensed values obtained from the first and second side displacement sensors, and may determine that the cassette is in a normal settlement status by comparing a difference between the first and second position deviation values with a third tolerance value.

According to an embodiment, the system controller may determine that the cassette is an abnormal settlement status and generates an alarm service informing error message.

A method of auto teaching a position of a cassette, comprises transporting a cassette accommodating a glass substrate into a port, sensing a position of the cassette through a plurality of displacement sensors disposed in the port in which the bottom part of the cassette is placed, generating a distortion amount of the cassette using a plurality of sensed values, determining whether the cassette is in a normal settlement status by comparing the distortion amount of the cassette with a tolerance value, generating a deviation value of the plurality of sensors with respect to a proper position by using the plurality of sensed values, and determining whether the cassette is in the normal settlement status by comparing the deviation value of the plurality of sensors with a tolerance.

According to an embodiment, the method may further comprise determining that the cassette is in an abnormal settlement status when the distortion amount is greater than a tolerance value, and generating an alarm service notifying an error message.

According to an embodiment, the method may further comprise generating a front deviation amount by using first and second sensed values, respectively sensed through first and second front displacement sensors respectively sensing distances from first and second sides of a front edge portion where a bottom part and a front part of the cassette are connected to each other, determining whether the cassette is in a normal settlement status by comparing the front deviation amount with a first tolerance value, generating a side deviation amount by using third and fourth sensed values, respectively sensed through first and second side displacement sensors respectively sensing distances from first and second sides of a side edge portion where a bottom part and a side part of the cassette are connected to each other, and determining whether the cassette is in a normal settlement status by comparing the side deviation amount with a second tolerance value.

According to an embodiment, the method may further comprise calculating a first position deviation amount by using a first distance between the first and second front displacement sensors, and the first and second sensed values obtained from the first and second front displace sensors, respectively, calculating a second position deviation amount by using a second distance between the first and second side displacement sensors, and the third and fourth sensed values obtained from the first and second side displace sensors, respectively, and determining whether the cassette is in a normal settlement status by comparing a difference between the first and second position deviations with a third tolerance value.

According to an embodiment, the method may further comprise determining that the cassette is in an abnormal settlement status when the front deviation amount is greater than the first tolerance value, the side deviation amount is greater than the second tolerance value or the difference between the first and second position deviations is greater than the third tolerance value, and generating an alarm service notifying an error message.

According to the embodiments of the present invention as described above, the clamping device for a clamping operation of each cassette placed in a port may be omitted, and only cassettes detected as abnormal settlement status can be identified and inspected by cassette position sensing. Accordingly, it is possible to prevent defects of the glass substrate by removing various defect-causing factors such as particles and static electricity that may occur during a conventional clamping operation. In particular, defects of OLED can be eliminated by preventing particles and static electricity that affect product quality defects in the OLED manufacturing process.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that, although the terms first, second, third etc. may be used herein to describe various elements, components, regions, layers and/or sections, these elements, components, and/or sections should not be limited by these terms. These terms are only used to distinguish one element, component, region, layer or section from another region, layer or section. Thus, a first element, component, or section discussed below could be termed a second element, component, or section without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Figure 1:
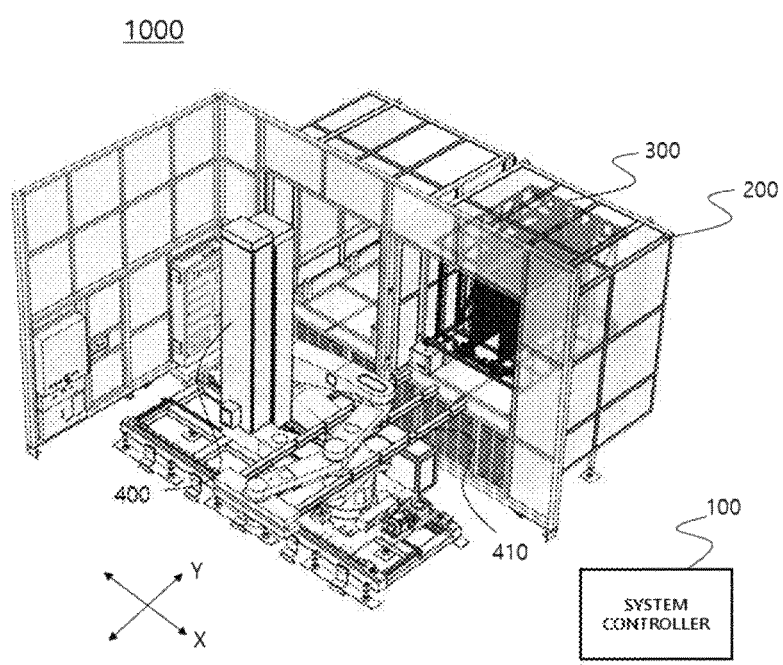
FIG. 1 is a perspective view illustrating a transportation system of a cassette according to an embodiment of the present invention.

FIG. 1 is a perspective view illustrating a transportation system of a cassette according to an embodiment of the present invention.

Referring to FIG. 1, a transportation system of a cassette 1000 according to the present embodiment may include a system controller 100, a port 200, a cassette 300 and a transfer robot 400.

The system controller 100 may manage and control overall driving of the transportation system of a cassette 1000. According to an embodiment, when a cassette 300 is placed in the port 200, a position of the cassette 300 is sensed by a plurality of displacement sensors included in the port 200. Using the sensed values, it can be determined whether the cassette 300 is normally disposed to the correct position in the port 200.

According to an embodiment, the system controller 100 calculates a distortion amount of the cassette based on a plurality of sensed values of the cassette 300. When the distortion amount is within an allowable error range, it is determined that the cassette 300 is normally disposed, and when the calculated distortion amount is out of the allowable error range, it is determined that the cassette 300 is abnormally disposed. When the system controller 100 determines that the cassette 300 is disposed abnormally, the system controller 100 may generate an alarm service for notifying an error message. An operator can recognize a position error of the cassette 300 through the alarm service and check the abnormally disposed cassette. In addition, it is possible to check whether there is an error in the transport operation of the rack master transporting the cassette.

According to an embodiment, a clamping operation for each cassette placed in a port, which is performed by a conventional clamping device, may be omitted, and it is possible to identify and to check only a cassette detected as an abnormal settlement status by the cassette position sensing. Accordingly, it is possible to prevent defects of the glass substrate by removing various defect-causing factors such as particles and static electricity that may occur during a conventional clamping operation.

The port 200 has a rectangular parallelepiped-shaped accommodation space, and can accommodate a rectangular parallelepiped-shaped cassette 300. Although not shown, the rack master may put the cassette 300 in the port 200.

According to an embodiment, in the port 200, a displacement sensor for sensing the position of the accommodated cassette 300 may be disposed in at least three corner regions among four corner regions corresponding to the lower portion of the accommodation space.

According to an embodiment, the displacement sensor may include a front displacement sensor sensing the position of the front side of the cassette 300 and a side displacement sensor sensing the position of the side of the cassette 300.

The cassette 300 includes a bottom part placed at a lower portion of the port 200, a top part facing the bottom part, a front part facing the transfer robot 400, a back part facing the front part and a rack master (not shown), and two side parts connecting the front part and the back part. The cassette 300 may accommodate a plurality of glass substrates.

The transfer robot 400 may include a hand 410 for inserting and withdrawing the glass substrate accommodated in the cassette 300. The transfer robot 400 may move in a traveling direction (X direction), and the hand 410 may move in an entry direction (Y direction).

The hand 410 may enter the front part of the cassette 300 to insert and withdraw the glass substrate accommodated in the cassette 300.

According to an embodiment, it is possible to automatically teach the position of the cassette placed in the port without the clamping operation of the clamping device. Accordingly, it is possible to prevent particles generated during the clamping operation of the cassette, and to prevent a defect in the glass substrate due to static electricity generated when the clamping device and the cassette come into contact.

Figure 2:
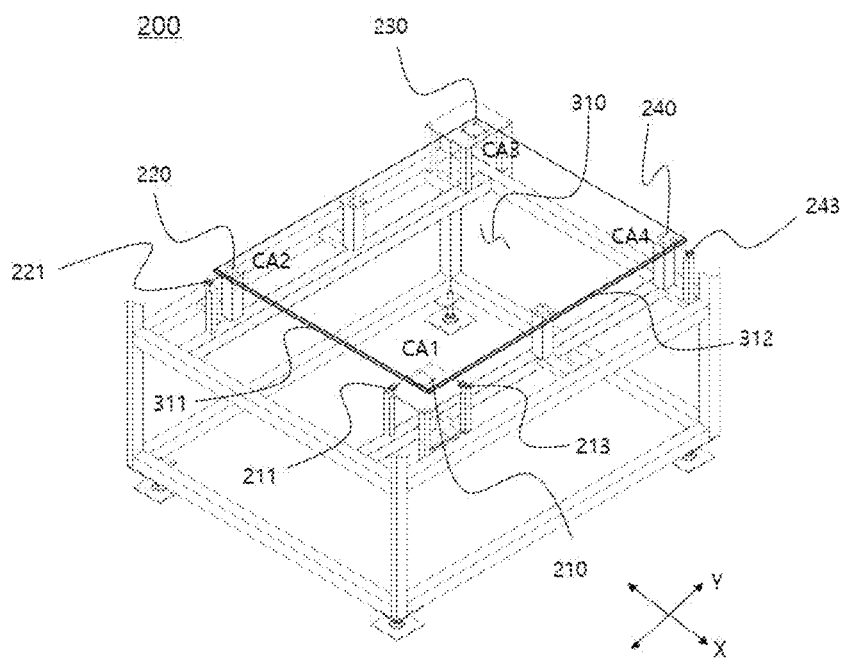
FIG. 2 is a perspective view illustrating a port according to an embodiment of the present invention.

FIG. 2 is a perspective view illustrating a port according to an embodiment of the present invention.

Referring to FIGS. 1 and 2, a plurality of support parts 210, 220, 230, and 240 for supporting the bottom part of the cassette 300 may be disposed at a lower portion of the port 200. The plurality of support parts 210, 220, 230, and 240 may support four corner regions CA1, CA2, CA3, and CA4 corresponding to the bottom part 310 of the cassette 300, respectively.

The first support part 210 may support the first corner region CA1 of the bottom part 310. A first front displacement sensor 211 and a first side displacement sensor 213 may be disposed adjacent to the first support 210. The first front displacement sensor 211 may sense a distance from the front edge portion 311 of the bottom part 310 connected to the front portion of the cassette 300. The first side displacement sensor 213 may sense a distance from the side edge 312 of the bottom part 310 of one side of the cassette 300.

The second support part 220 may support the second corner region CA2 of the bottom part 310. A second front displacement sensor 221 may be disposed adjacent to the second support 220. The second front displacement sensor 221 may sense a distance from the front edge portion 311 of the bottom part 310 connected to the front portion of the cassette 300. The second front displacement sensor 221 may be disposed on the same line as the first front displacement sensor 211.

The third support part 230 may support the third corner region CA3 of the bottom part 310.

The fourth support part 240 may support the fourth corner region CA4 of the bottom part 310. A second side displacement sensor 243 may be disposed adjacent to the fourth support part 240. The second side displacement sensor 243 may sense a distance from the side edge 312 of the bottom part 310 of the one side of the cassette 300. The second side displacement sensor 243 may be disposed on the same line as the first side displacement sensor 213.

The first front displacement sensor 211 disposed in the first corner region CA1 may sense a distance from the first side of the front edge portion 311 and may provide a first sensed value to the system controller 100.

The second front displacement sensor 221 disposed in the second corner region CA2 may sense a distance from the second side of the front edge portion 311 and may provide a second sensed value to the system controller 100.

The first side displacement sensor 213 disposed in the first corner region CA1 may sense a distance from a first side of the side edge portion 312 and may provide a third sensed value to the system controller 100.

The second side displacement sensor 243 disposed in the fourth corner region CA4 may sense a distance from the second side of the side corner portion 312 and may provide a fourth sensed value to the system controller 100.

Figure 3:
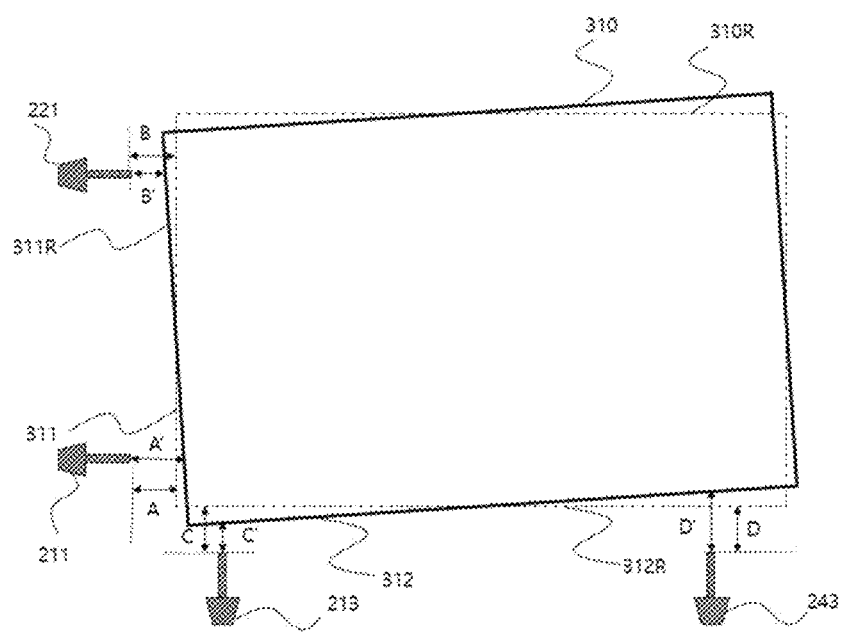
FIG. 3 is a conceptual diagram illustrating a method of auto teaching a position of a cassette of a transportation system according to an embodiment of the present invention.

FIG. 3 is a conceptual diagram illustrating a method of auto teaching a position of a cassette of a transportation system according to an embodiment of the present invention.

Referring to FIGS. 1 to 3, when a first cassette is transported and the bottom part 310R of the first cassette is placed at a reference position in a port, a plurality of displacement sensors disposed in the port senses a distance from the first front edge portion 311R of the first cassette and from the first side edge portion 312R of the first cassette, respectively.

In detail, a first front displacement sensor 211 senses a distance from a first side of the first front edge portion 311R, and provides a first reference sensed value A to the system controller 100. A second front displacement sensor 221 senses a distance from a second side of the first front edge portion 311B, and provides a second reference sensed value B to the system controller 100. A first side displacement sensor 213 senses a distance from a first side of the first side edge portion 312R, and provides a third reference sensed value C to the system controller 100. A second side displacement sensor 243 senses a distance from a second side of the first side edge portion 312R and provides a fourth reference sensed value D to the system controller 100.

The system controller 100 may store the first, second, third and fourth reference sensed values A, B, C, and D in a memory, which correspond to the position of the first cassette placed at the reference position in the port.

When a second cassette is transported into the port and the bottom part 310 of the second cassette is placed in the port, the plurality of displacement sensors disposed in the port senses a distance from a second front edge portion 311 of the second cassette and a second side edge portion 312 of the second cassette, respectively.

In detail, the first front displacement sensor 211 senses a distance from the first side of the second front edge portion 311, and provides the first measured sensed value A' to the system controller 100. The second front displacement sensor 221 senses a distance from the second side of the second front edge portion 311, and provides a second measured sensed value B' to the system controller 100. The first side displacement sensor 213 senses a distance from the first side of the second side edge portion 312, and provides a third measured sensed value C'' to the system controller 100. The second side displacement sensor 243 senses a distance from the second side of the second side edge portion 312, and provides a fourth measured sensed value D' to the system controller 100.

The system controller 100 may store the first, second, third, and fourth measured sensed values A', B'', C'', D'' corresponding to the position of the second cassette in the memory. The system controller 100 uses the first and second reference sensed values A and B and the first and second measured sensed values A' and B' of the second cassette to generate a front deviation amount (Depth1) of the second cassette. The system controller 100 may determine a normal settlement status of the second cassette by comparing the front deviation amount (Depth1) of the second cassette with a first tolerance value (Limit1). For example, when the front deviation amount (Depth1) of the second cassette is less than the first tolerance value (Limit1), it may be determined as a normal settlement status, and when the front deviation amount (Depth1) of the second cassette is greater than the first tolerance value, it may be determined as an abnormal settlement status.

The front deviation amount (Depth1) and the first tolerance value (Limit1) may be expressed as in Equation 1 below.

$$Depth1=ABS(A-A'), ABS(B-B')<Limit1, \qquad \text{Equation 1}$$

The system controller 100 uses the third and fourth reference sensed values C and D and the third and fourth measured sensed values C' and D' of the second cassette to generate a side deviation amount Depth2 of the second cassette. The system controller 100 may determine the normal settlement status of the second cassette by comparing the side deviation amount (Depth2) of the second cassette with a second tolerance value (Limit2). For example, when the side deviation amount (Depth2) of the second cassette is less than the second tolerance value (Limit2), it is determined as normal settlement status, and when the side deviation amount (Depth2) of the second cassette is greater than the second tolerance value (Limit2), it can be determined as abnormal settlement status.

The side deviation amount (Depth2) and the second tolerance value (Limit2) may be expressed as in Equation 2 below.

$$Depth2=ABS(C-C'), ABS(D-D')<Limit1, \qquad \text{Equation 2}$$

The system controller 100 may calculate the shifted amount of the first front displacement sensor 211, the second front displacement sensor 221, the first side displacement sensor 213, and the second side displacement sensor 243 from the respective set positions, and may determine whether the displacement sensors 211, 221, 213 and 243 are normally located within a normal range.

The system controller 100 may store a first distance value H between the first and second front displacement sensors 211 and 221, and may store a second distance value L between the first and second side displacement sensors 213 and 243, in a memory.

The system controller 100 may calculate a first position deviation amount Theta1 corresponding to a misplaced amount of the first and the second front displacement sensors 211 and 221 with respect to the proper position, by using the first distance value H, the first and second reference sensed values A and B and the first and second measured sensed values A' and B' of the second cassette.

The system controller 100 may calculate a second position deviation amount Theta2 corresponding to a misplaced amount of the first and the second side displacement sensors 213 and 243 with respect to the proper position, by using the second distance value L, the third and fourth reference sensed values C and D, and the third and fourth measured sensed values C'' and D' of the second cassette.

The first position deviation amount Theta1 and the second position deviation amount Theta2 may be expressed as in Equation 3 below.

$$Theta1=ATAN(((A-A')-(B-B'))/H)$$

$$Theta2=ATAN(((C-C')-(D-D'))/L) \qquad \text{Equation 3}$$

The system controller 100 compares the first and second position deviation amounts Theta1 and Theta2 with the third tolerance value Limit3, to determine whether the first and the second front displacement sensors 211 and 221 and the first and the second side displacement sensors 213 and 243 are in a poor measurement state.

For example, the system controller 100 determines that the displacement sensors 211, 221, 213, and 243 are in a good measurement state, when the difference (ABS(Theta1-Theta2)) between the first and second position deviation amounts Theta1 and Theta2 is smaller than the third tolerance value Limit3, since the displacement sensors 211, 221, 213, and 243 are in a proper position range.

On the other hand, the system controller 100 determines that the displacement sensors 211, 221, 213, and 243 are in a poor measurement state, when the difference (ABS (Theta1-Theta2)) between the first and second position deviation amounts Theta1 and Theta2 is greater than the third tolerance value Limit3, since the displacement sensors 211, 221, 213, and 243 are out of the proper position range. In this case, the system controller 100 may determine that a cassette is in an abnormal settlement state, since the displacement sensors 211, 221, 213, and 243 are in the poor measurement state.

Figure 4:
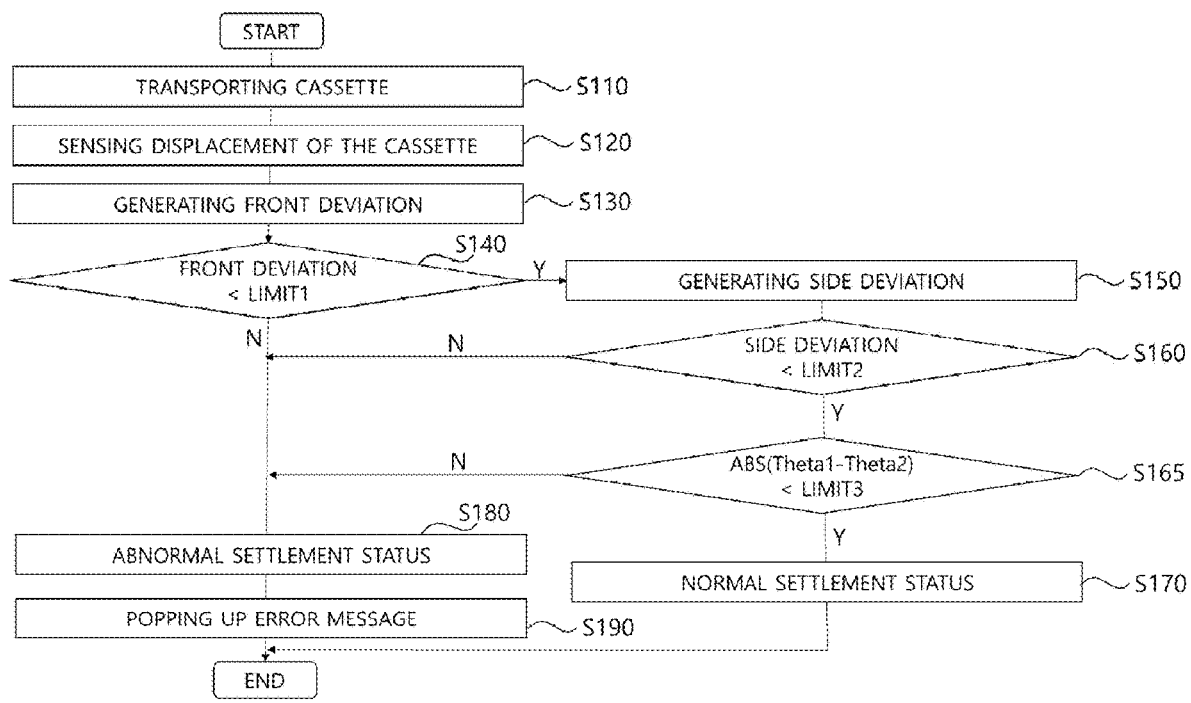
FIG. 4 is a flowchart illustrating a method of auto teaching a position of a cassette according to an embodiment of the present invention.

FIG. 4 is a flowchart illustrating a method of auto teaching a position of a cassette according to an embodiment of the present invention.

Referring to FIGS. 1 to 4, the system controller 100 may include a memory storing the first, second, third, and fourth reference sensed values A, B, C, D.

When the cassette 300 is transported into the port 200, the bottom part 310 of the cassette is placed at a lower portion of the port 200 (step S110).

A plurality of displacement sensors in the port 200 senses distances from the front edge portion 311 and the side edge portion 312 of the cassette 300 and provide the measured sensed values to the system controller 100 (step S120).

In detail, the first front displacement sensor 211 senses a distance from the first side of the front edge portion 311, and the second front displacement sensor 221 senses a distance from the second side of the front edge portion 311, the first side displacement sensor 213 senses a distance from the first side of the side edge portion 312, and the second side displacement sensor 243 senses the distance from the second side of the side edge portion 312.

The first and second front displacement sensors 211 and 221 provide first and second measured sensed values A' and B' that are distance from the front edge 311 of the cassette 300 to the system controller 100, and the first and second side displacement sensors 213 and 243 provide third and fourth measured sensed values C' and D' that are distance from the side edge portion 312 of the cassette 300 to the system controller 100.

The system controller 100 determines whether the cassette is normally transported by comparing the first, second, third and fourth measured sensed values A', B", C", D' with the the first, second, third, and fourth reference sensed values A, B, C, D.

For example, the system controller 100 uses the first and second reference sensed values A and B and the first and second measured sensed values A' and B' of the cassette 300 to generate the front deviation amount of the cassette 300 (step S130).

The system controller 100 may determine whether the cassette is in the normal settlement status by comparing the front deviation amount of the cassette 300 with a first tolerance value (Limit1) (step S140). For example, when the front deviation amount of the cassette 300 is less than the first tolerance value, it is determined as a normal settlement status.

When the front deviation amount of the cassette 300 is greater than the first tolerance value (Limit1), the system controller 100 determines that it is in an abnormal settlement status (step S180), and provides an information of the abnormal settlement status of the cassette 300 to the operator in such a way of an alarm service popping up an error message (step S190).

The operator may recognize that the cassette 300 is in an abnormal settlement status by the alarm service, check the conveyance status of the cassette 300, and take appropriate procedure.

On the other hand, when the front deviation amount of the cassette 300 is less than the first tolerance value, the system controller 100 uses the third and fourth reference sensed values C and D and the third and fourth measured sensed values C' and D' of the cassette 300 to generate side deviation amount (step S150).

The system controller 100 may determine whether the cassette is in a normal settlement status by comparing the side deviation amount of the cassette with a second tolerance value (Limit2) (step S160).

The system controller 100 may determine that the cassette is in an abnormal settlement status when the side deviation amount of the cassette 300 is greater than the second tolerance value (Limit2) (step S180), and may provide an operator with an alarm service to notify the abnormal settlement status (step S190).

On the other hand, the system controller 100 may determine whether the displacement sensors 211, 221, 213 are 243 are properly positioned within a proper position range, by comparing the difference between the first and second position deviation amounts Theta1 and Theta2 with the third tolerance value Limit3 (step S165).

For example, the system controller 100 may calculate a first position deviation amount Theta1 corresponding to a misplaced amount of the first and the second front displacement sensors 211 and 221 with respect to the proper position, by using the first distance value H which is a distance between the first and second front displacement sensors 211 and 221, the first and second reference sensed values A and B and the first and second measured sensed values A' and B' of the second cassette.

The system controller 100 may calculate a second position deviation amount Theta2 corresponding to a misplaced amount of the first and the second side displacement sensors 213 and 243 with respect to the proper position, by using the second distance value L which is a distance between the first and second side displacement sensors 213 and 243, the third and fourth reference sensed values C and D, and the third and fourth measured sensed values C" and D' of the second cassette.

The system controller 100 may determines whether the displacement sensors 211, 221, 213, and 243 are in a poor measurement state, by comparing the difference between the first and second position deviation amounts Theta1 and Theta2 with the third tolerance value Limit3.

For example, the system controller 100 may determine that the displacement sensors 211, 221, 213, and 243 are in a good measurement state, when the difference (ABS (Theta1-Theta2)) between the first and second position deviation amounts Theta1 and Theta2 is smaller than the third tolerance value Limit3 (step S165), since the displacement sensors 211, 221, 213, and 243 are in a proper position range. Therefore, the system controller 100 may determine the cassette is in a normal settlement status (step S170).

On the other hand, the system controller 100 may determine that the displacement sensors 211, 221, 213, and 243 are in a poor measurement state, when the difference (ABS (Theta1-Theta2)) between the first and second position deviation amounts Theta1 and Theta2 is greater than the third tolerance value Limit3 (step S165), since the displacement sensors 211, 221, 213, and 243 are out of the proper position range.

Therefore, the system controller 100 may provide an information of the abnormal settlement status of the cassette 300 to an operator in such a way of an alarm service popping up an error message (step S190).

The operator may recognize that the cassette 300 is in an abnormal settlement status by the alarm service, check the conveyance status of the cassette 300 and positions of the displacement sensors 211, 221, 213 and 243, and take appropriate procedure.

According to an embodiment, the system controller 100 may store and manage the first to fourth measurement values, which are location information of the cassette, in a memory. The position information of the cassette stored in the memory may be used when the transfer robot 400 performs an operation of inserting and withdrawing the glass substrate accommodated in the cassette.

According to the present embodiment, it is omitted that a clamping device clamps each cassette in each port, and only a cassette determined as in an abnormal settlement status is identified and checked. Accordingly, it is possible to prevent defects of the glass substrate by removing various defect-causing factors such as particles and static electricity that may occur during a conventional clamping operation. In particular, quality defects of OLED can be eliminated by preventing particles and static electricity that affect product quality defects in the OLED manufacturing process.

It will be apparent to those skilled in the art that various modifications and variation may be made in the present invention without departing from the spirit or scope of the invention. Thus, it is intended that the present invention cover the modifications and variations of this invention provided they come within the scope of the appended claims and their equivalents.

What is claimed is:

1. A transportation system of a cassette comprising:
   a port accommodating a cassette carrying a glass substrate, the port including a plurality of displacement sensors for sensing a position of a cassette; and
   a system controller for calculating a distortion amount of the cassette using a plurality of sensed values of the cassette and a misplaced amount of the displacement sensors to determine whether the cassette is in a normal settlement status.

2. The transportation system of a cassette of claim 1, wherein the system controller determines that the cassette is in an abnormal settlement status when the distortion amount of the cassette is greater than a tolerance value, and generates an alarm service informing an error message.

3. The transportation system of a cassette of claim 1, wherein the plurality of displacement sensors comprises:
   at least one front displacement sensor sensing a distance from a front part of the cassette; and
   at least one side displacement sensor for sensing a distance from a side part of the cassette.

4. The transportation system of a cassette of claim 1, wherein the plurality of displacement sensors comprises:
   a first front displacement sensor and a second front displacement sensor respectively sensing distances from a first side and a second side of a front edge portion where a bottom part and a front part of the cassette are connected to each other; and
   a first side displacement sensor and a second side displacement sensor respectively sensing distances from a first side and a second side of a side edge portion where the bottom part and a side part of the cassette are connected to each other.

5. The transportation system of a cassette of claim 4, wherein the system controller
   generates a front deviation amount using first and second sensed values respectively sensed by the first and second front displacement sensors;
   generates a side deviation amount using third and fourth measured sensed values respectively sensed by the first and second side displacement sensors; and
   compares the front deviation amount and the side deviation amount with a first and second tolerance values, respectively to determine a normal settlement status of the cassette.

6. The transportation system of a cassette of claim 5, wherein the system controller calculates a first position deviation value by using a first distance between the first and second front displacement sensors, and first and second sensed values obtained from the first and second front displacement sensors,
   calculates a second position deviation value by using a second distance between the first and second side displacement sensors, and third and fourth sensed values obtained from the first and second side displacement sensors, and
   determines that the cassette is in a normal settlement status by comparing a difference between the first and second position deviation values with a third tolerance value.

7. The transportation system of a cassette of claim of 6, wherein the system controller determines that the cassette is an abnormal settlement status and generates an alarm service informing error message.

8. A method of auto teaching a position of a cassette, the method comprising:
   transporting a cassette accommodating a glass substrate into a port;
   sensing a position of the cassette through a plurality of displacement sensors disposed in the port in which the bottom part of the cassette is placed;
   generating a distortion amount of the cassette using a plurality of sensed values;
   determining whether the cassette is in a normal settlement status by comparing the distortion amount of the cassette with a tolerance value;
   generating a deviation value of the plurality of sensors with respect to a proper position by using the plurality of sensed values; and
   determining whether the cassette is in the normal settlement status by comparing the deviation value of the plurality of sensors with a tolerance.

9. The method of claim 8, further comprising:
   determining that the cassette is in an abnormal settlement status when the distortion amount is greater than a tolerance value; and
   generating an alarm service notifying an error message.

10. The method of claim 9, further comprising:
    generating a front deviation amount by using first and second sensed values, respectively sensed through first and second front displacement sensors respectively sensing distances from first and second sides of a front edge portion where a bottom part and a front part of the cassette are connected to each other;
    determining whether the cassette is in a normal settlement status by comparing the front deviation amount with a first tolerance value;
    generating a side deviation amount by using third and fourth sensed values, respectively sensed through first and second side displacement sensors respectively sensing distances from first and second sides of a side edge portion where a bottom part and a side part of the cassette are connected to each other; and determining whether the cassette is in a normal settlement status by comparing the side deviation amount with a second tolerance value.

11. The method of claim 10, further comprising:

calculating a first position deviation amount by using a first distance between the first and second front displacement sensors, and the first and second sensed values obtained from the first and second front displace sensors, respectively;

calculating a second position deviation amount by using a second distance between the first and second side displacement sensors, and the third and fourth sensed values obtained from the first and second side displace sensors, respectively; and determining whether the cassette is in a normal settlement status by comparing a difference between the first and second position deviations with a third tolerance value.

12. The method of claim 11, further comprising:

determining that the cassette is in an abnormal settlement status when the front deviation amount is greater than the first tolerance value, the side deviation amount is greater than the second tolerance value or the difference between the first and second position deviations is greater than the third tolerance value; and generating an alarm service notifying an error message.

* * * * *